(12) United States Patent
Ando et al.

(10) Patent No.: US 10,505,112 B1
(45) Date of Patent: Dec. 10, 2019

(54) CMOS COMPATIBLE NON-FILAMENTARY RESISTIVE MEMORY STACK

(71) Applicant: International Business Machines Corporation, Armonk, NY (US)

(72) Inventors: Takashi Ando, Tuckahoe, NY (US); Eduard A. Cartier, New York, NY (US); Adam M. Pyzyna, Cortlandt Manor, NY (US); John Bruley, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/018,715

(22) Filed: Jun. 26, 2018

(51) Int. Cl.
*H01L 27/24* (2006.01)
*H01L 45/00* (2006.01)

(52) U.S. Cl.
CPC ........ *H01L 45/146* (2013.01); *H01L 27/2463* (2013.01); *H01L 45/08* (2013.01); *H01L 45/1233* (2013.01); *H01L 45/1675* (2013.01)

(58) Field of Classification Search
CPC .................................................. H01L 27/2463
See application file for complete search history.

(56) References Cited

U.S. PATENT DOCUMENTS

| 7,229,883 | B2 | 6/2007 | Wang et al. |
| 8,846,484 | B2 | 9/2014 | Lee et al. |
| 9,502,647 | B2 | 11/2016 | Chang et al. |
| 9,601,546 | B1 | 3/2017 | Ando et al. |
| 9,754,665 | B2 | 9/2017 | Chen et al. |
| 9,806,256 | B1 | 10/2017 | Wu et al. |
| 2017/0244028 | A1* | 8/2017 | Wang ............ H01L 45/08 |
| 2017/0309324 | A1 | 10/2017 | Kumar et al. |

OTHER PUBLICATIONS

H-S. Philip Wong et al., "Metal-oxide RRAM," Proceedings of the IEEE, vol. 100, No. 6, Jun. 2012, pp. 1951-1970.
Jen-Chieh Liu et al., "Investigating MLC variation of filamentary and non-filamentary RRAM." VLSI Technology, Systems and Application (VLSI-TSA), Apr. 2014, 2 pages.
Kan-Hao Xue et al., "A non-filamentary model for unipolar switching transition metal oxide resistance random access memories," Journal of Applied Physics, vol. 109, No. 9, May 2011, 091602, 6 pages.
Huaqiang Wu et al., "Resistive Random Access Memory for Future Information Processing System," Proceedings of the IEEE, vol. 105, No. 9, Sep. 2017, pp. 1770-1789.

* cited by examiner

*Primary Examiner* — William A Harriston
(74) *Attorney, Agent, or Firm* — Vazken Alexanian; Michael J. Chang, LLC

(57) ABSTRACT

CMOS-compatible non-filamentary RRAM devices and techniques for formation thereof are provided. In one aspect, a method of forming a non-filamentary RRAM device includes: depositing a base oxide layer (e.g., hafnium oxide) on a bottom electrode; depositing a cap layer (e.g., amorphous silicon) on the base oxide layer; and depositing a top electrode on the cap layer, wherein the cap layer and the top electrode are deposited in-situ without any air exposure in between such that there is an absence of oxide at an interface between the cap layer and the top electrode. A low resistivity layer can optionally be deposited on the top electrode. An RRAM device and a computing device having a crossbar array of the present RRAM cells are also provided.

19 Claims, 5 Drawing Sheets

CMOS COMPATIBLE NON-FILAMENTARY RESISTIVE MEMORY STACK

FIELD OF THE INVENTION

The present invention relates to resistive random access memory (RRAM), and more particularly, to a complementary metal oxide semiconductor (CMOS) compatible non-filamentary RRAM devices and techniques for formation thereof.

BACKGROUND OF THE INVENTION

Resistive random access memory (RRAM) is considered a promising technology for electronic synapse devices or memristors for neuromorphic computing as well as high-density and high-speed non-volatile memory applications. For instance, in neuromorphic computing applications, a resistive memory device can be used as a connection (synapse) between a pre-neuron and post-neuron, representing the connection weight in the form of device resistance. Multiple pre-neurons and post-neurons can be connected through a crossbar array of RRAMs, which naturally expresses a fully-connected neural network.

In order to make a large-scale crossbar array, each cross point in the array must have a high resistivity (or low leakage current). Otherwise, voltage drop across the metal lines becomes significant.

However, it is typically very difficult to maintain high device resistivity after filament formation for Conductive Bridging RAM (CBRAM) or Oxide-based RRAM. In addition, filamentary RRAMs have high device variability.

Non-filamentary RRAM (e.g. PCMO) can mitigate these drawbacks. However, current state of the art non-filamentary RRAM employ exotic materials which are not complementary metal oxide semiconductor (CMOS) compatible.

Therefore, non-filamentary RRAM devices that are CMOS-compatible would be desirable.

SUMMARY OF THE INVENTION

The present invention provides complementary metal oxide semiconductor (CMOS) compatible non-filamentary resistive memory stack and techniques for formation thereof. In one aspect of the invention, a method of forming a non-filamentary RRAM device is provided. The method includes: depositing a base oxide layer (e.g., hafnium oxide) on a bottom electrode; depositing a cap layer (e.g., amorphous silicon) on the base oxide layer; and depositing a top electrode on the cap layer, wherein the cap layer and the top electrode are deposited in-situ without any air exposure in between such that there is an absence of oxide at an interface between the cap layer and the top electrode. A low resistivity layer can optionally be deposited on the top electrode.

In another aspect of the invention, an RRAM device is provided. The RRAM device includes: a bottom electrode; a base oxide layer disposed on the bottom electrode; a cap layer disposed on the base oxide layer; and a top electrode disposed on the cap layer, wherein the cap layer is un-oxidized such that there is an absence of oxide at an interface between the cap layer and the top electrode. A low resistivity layer can optionally be disposed on the top electrode.

In yet another aspect of the invention, a computing device is provided. The computing device includes: a plurality of first metal lines oriented orthogonal to a plurality of second metal lines; and RRAM cells between the first metal lines and the second metal lines, at intersections of the first metal lines and the second metal lines. Each of the RRAM cells includes: a bottom electrode; a base oxide layer disposed on the bottom electrode; a cap layer disposed on the base oxide layer; and a top electrode disposed on the cap layer, wherein the cap layer is un-oxidized such that there is an absence of oxide at an interface between the cap layer and the top electrode.

A more complete understanding of the present invention, as well as further features and advantages of the present invention, will be obtained by reference to the following detailed description and drawings.

DETAILED DESCRIPTION OF PREFERRED EMBODIMENTS

Provided herein are non-filamentary resistive random access memory (RRAM) devices. Advantageously, these RRAM devices include only complementary metal oxide semiconductor (CMOS)-compatible materials and processes. In an exemplary embodiment described in detail below, the present RRAM devices form cells in crossbar array, wherein each cell is a synapse between a pre-neuron and post-neuron for neuromorphic computing.

Figure 1:
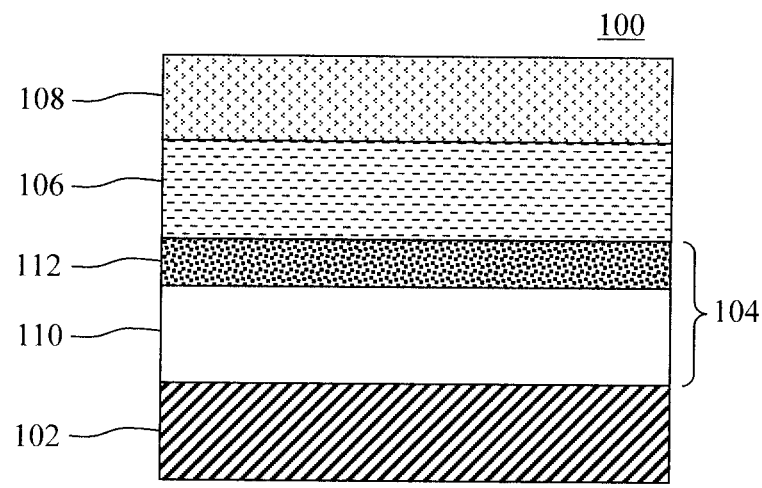
FIG. 1 is a cross-sectional diagram illustrating an exemplary resistive random access memory (RRAM) device according to an embodiment of the present invention.

An exemplary RRAM device 100 in accordance with the present techniques is shown in FIG. 1. Generally, the present RRAM devices are formed from a metal-insulator-metal resistive stack. Data is stored in the device in the form of device resistance as either a low or a high resistive state. For instance, applying a voltage bias sets the device to a low resistance state. Applying a voltage bias with the opposite polarity resets the device back to a high resistance state.

For applications such as neuromorphic computing, the same voltage is applied to all of the cells in a crossbar array. Thus, an important design consideration of the present RRAM devices is to suppress voltage drop across metal lines. To do so, device resistance needs to be increased. High resistance cannot be easily achieved with filamentary RRAM devices. Non-filamentary RRAM, on the other hand, can achieve high resistance. However, most state of the art non-filamentary designs require exotic elements such as perovskites which are largely not compatible with standard CMOS processing conditions such as elevated temperatures. Thus, the non-filamentary RRAM designs to date do not provide a practical solution for widespread production and use. Advantageously, the present RRAM device designs achieve megaohm (MΩ)-level resistance using only CMOS-compatible materials and fabrication processes.

As shown in FIG. 1, RRAM device 100 includes a bottom electrode 102, an insulator 104, a top electrode 106, and an optional low resistivity layer 108. Suitable materials for the bottom electrode 102 include, but are not limited to, titanium nitride (TiN), tantalum nitride (TaN) and/or tungsten (W). According to an exemplary embodiment, the bottom electrode 102 has a thickness of from about 100 angstroms (Å) to about 500 Å and ranges therebetween.

The insulator 104 includes two layers, a base oxide layer 110 and a cap layer 112 that 'caps' the base oxide layer 110. The term 'base' indicates that layer 110 is the main switching media whereas layer 112 serves a secondary role to assist the switching. Importantly, as will be described in further detail below, the cap layer 112 is un-oxidized based on the in-situ deposition of the cap layer 112 and the top electrode 106 without any air exposure in between. The un-oxidized cap layer 112 is detectable in the end-product device based on the absence of any oxide at the interface between the cap layer 112 and the top electrode 106.

Suitable materials for the cap layer 112 include, but are not limited to, amorphous silicon (Si). As provided above, the cap layer 112 is un-oxidized. Oxidation of amorphous Si converts it to $SiO_2$, which undesirably has a significantly wider bandgap, and disturbs the non-filamentary switching that is the focus of the present techniques. Suitable materials for the base oxide layer 110 include, but are not limited to, metal oxides such as hafnium oxide ($HfO_2$). According to an exemplary embodiment, the base oxide layer 110 has a thickness of from about 10 Å to about 50 Å and ranges therebetween. According to an exemplary embodiment, the cap layer 112 has a thickness of from about 5 Å to about 20 Å and ranges therebetween.

Suitable materials for the top electrode 106 include, but are not limited to, TiN and/or TaN. According to an exemplary embodiment, the top electrode 106 has a thickness of from about 100 Å to about 500 Å and ranges therebetween. As provided above, the cap layer 112 and the top electrode 106 are deposited in-situ without any air exposure in between, resulting in the cap layer 112 being un-oxidized, i.e., there is no oxide detectable at the interface between the cap layer 112 and the top electrode 106.

Suitable materials for the low resistivity layer 108 include, but are not limited to, TaN, W, aluminum (Al) and/or copper (Cu). According to an exemplary embodiment, the low resistivity layer 108 has a thickness of from about 100 Å to about 500 Å and ranges therebetween. As provided above, use of a low resistivity layer 108 is optional. For instance, for large RRAM cell area, use of a low resistivity layer 108 is preferable to sufficiently reduce spreading resistance. On the other hand, the top electrode (e.g. TiN) may be sufficient if the RRAM cell area is small. Thus, the need depends on the target RRAM cell area.

Figure 2:
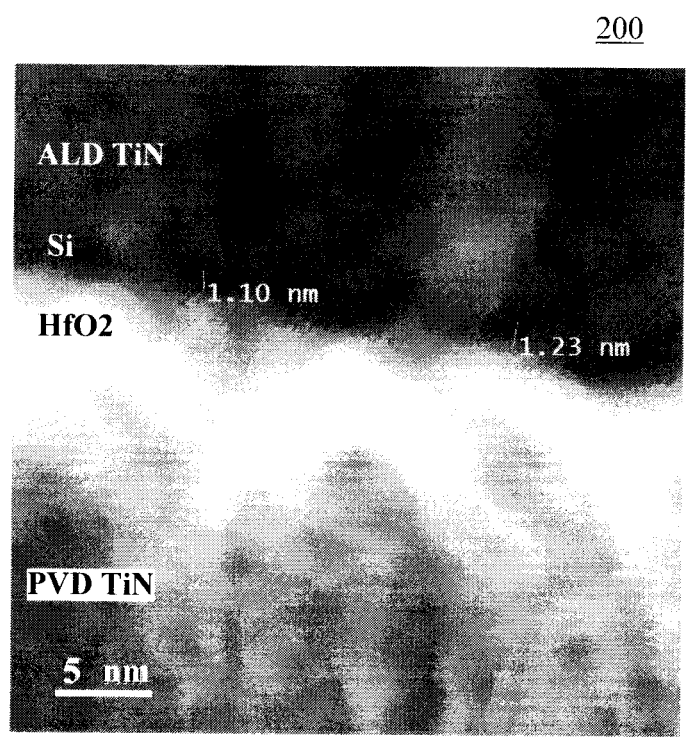
FIG. 2 is an image of the exemplary RRAM device fabricated in accordance with the present techniques according to an embodiment of the present invention.

FIG. 2 is an image 200 of an exemplary RRAM device 100 fabricated in accordance with the present techniques. In this example, RRAM device 100 includes a bottom electrode of physical vapor deposition (PVD) TiN, a base oxide layer of $HfO_2$, a cap layer of amorphous Si, and a top electrode of atomic layer deposition (ALD) TiN. No low resistivity layer is present in this example. The heavy mass elements (e.g., $HfO_2$) appear lighter in image 200 and the lighter mass elements (e.g., amorphous Si and TiN) appear darker in image 200. Notably, there is no (lighter-appearance) oxide visible between the cap layer and the top electrode, which is an important feature of the present design. As provided above, this is due to the cap layer and the top electrode being deposited in-situ without any air exposure in between.

Figure 3:
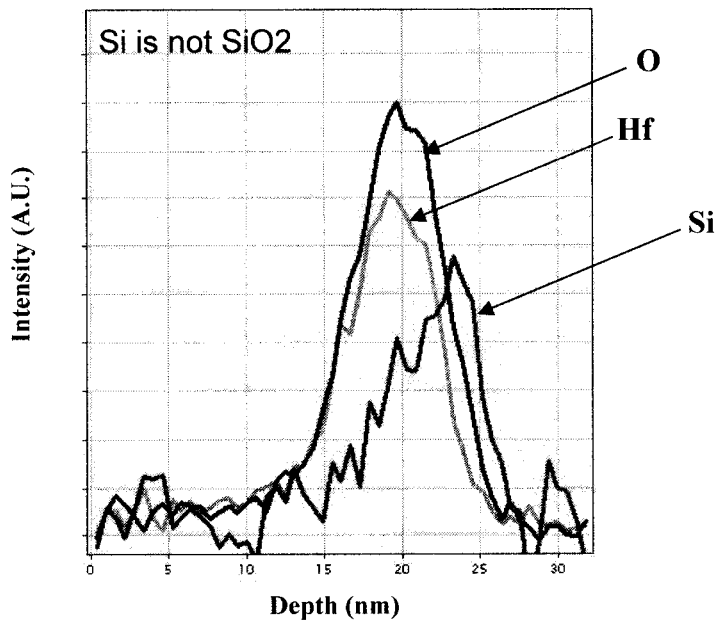
FIG. 3 is a plot illustrating an elemental profile of the exemplary RRAM device of FIG. 2 showing that the amorphous silicon (Si) cap layer is not oxidized according to an embodiment of the present invention.

To demonstrate this point, FIG. 3 is a plot 300 illustrating an elemental profile of the exemplary RRAM device 100 of FIG. 2 which clearly shows that the amorphous Si cap layer is not oxidized. Namely, as shown in FIG. 3, amorphous Si (cap layer) is not present in an oxidized form, i.e., silicon dioxide ($SiO_2$). In plot 300, intensities of electron energy loss spectroscopy (EELS) signals for Hf, Si, 0 are plotted as a function of depth from the sample surface.

Figure 4:
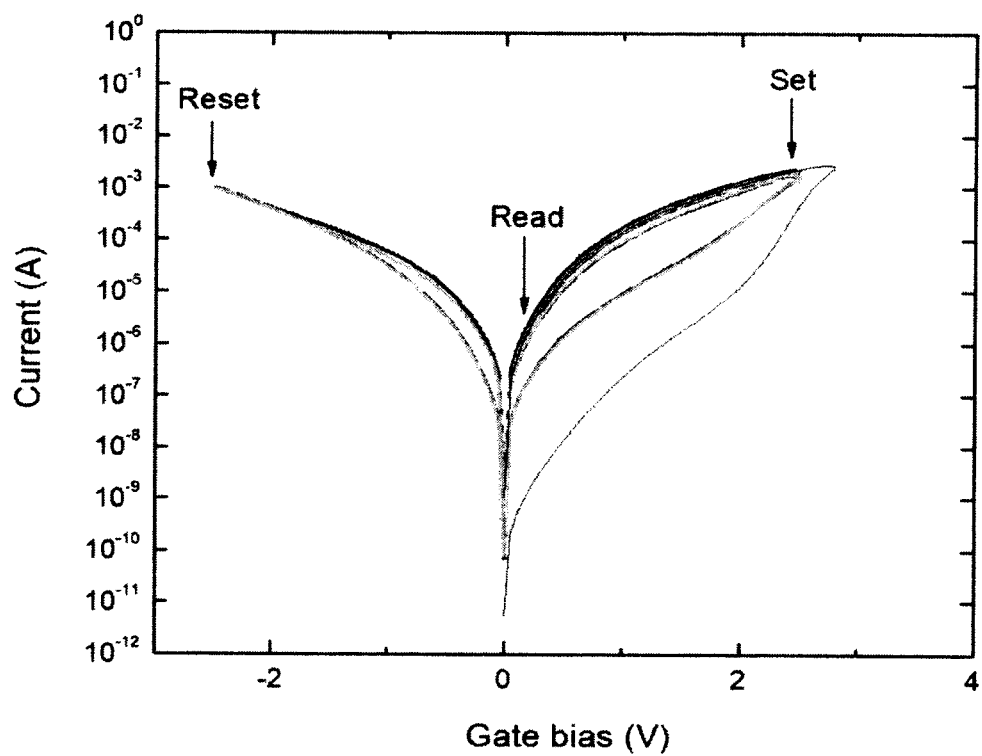
FIG. 4 is a plot illustrating the switching characteristics of the present RRAM devices according to an embodiment of the present invention.

FIG. 4 is a plot 400 illustrating the switching characteristics of the present RRAM devices. In plot 400, the device current measured in amps (A) is plotted as a function of applied gate bias measured in volts (V). Plot 400 confirms that bipolar resistive switching between the low resistivity state and the high resistivity state occurs in the present RRAM devices without forming a current conducting filament. The currents scale with device area, which indicates non-filamentary switching.

Further, the devices exhibit positive gradual/uniform IV curves which would not be the case with filamentary devices. Specifically, filamentary devices require a step to brake the filament during switching. This results in stochastic behavior in filamentary devices. Such stochastic behavior is not exhibited by the present RRAM devices due to their non-filamentary nature.

Also, the device resistivity is in the MΩ range for 50×50 $\mu m^2$ device. The device resistivity becomes even higher as the area of the RRAM cell is scaled.

Figure 5:
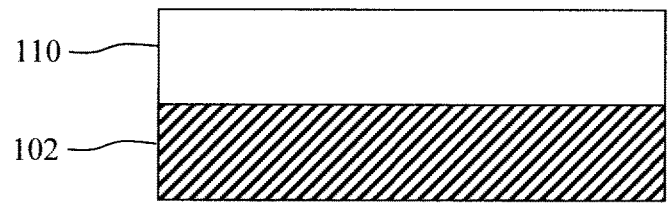
FIG. 5 is a cross-sectional diagram illustrating a base oxide layer having been deposited on a bottom electrode according to an embodiment of the present invention.

An exemplary methodology for forming RRAM device 100 is now described by way of reference to FIGS. 5-9. As shown in FIG. 5, the process begins with the deposition of the base oxide layer 110 on the bottom electrode 102. As provided above, suitable materials for the bottom electrode 102 include, but are not limited to, TiN, TaN and/or tungsten W. According to an exemplary embodiment, the bottom electrode 102 has a thickness of from about 100 Å to about 500 Å and ranges therebetween. As provided above, suitable materials for the base oxide layer 110 include, but are not limited to, metal oxides such as hafnium oxide ($HfO_2$). According to an exemplary embodiment, the base oxide layer 110 has a thickness of from about 10 Å to about 50 Å and ranges therebetween. Any suitable deposition process including, but not limited to, atomic layer deposition (ALD), chemical vapor deposition (CVD), and physical vapor deposition (PVD) may be employed to deposit the base oxide layer 110 on the bottom electrode 102.

Next, the cap layer 112 is deposited onto the base oxide layer 110. See FIG. 6. The base oxide layer 110 and the cap layer 112 together form the insulator 104 on the back electrode 102. As provided above, suitable materials for the cap layer 112 include, but are not limited to, amorphous silicon (Si). According to an exemplary embodiment, the cap layer 112 has a thickness of from about 5 Å to about 20 Å and ranges therebetween.

Figure 6:
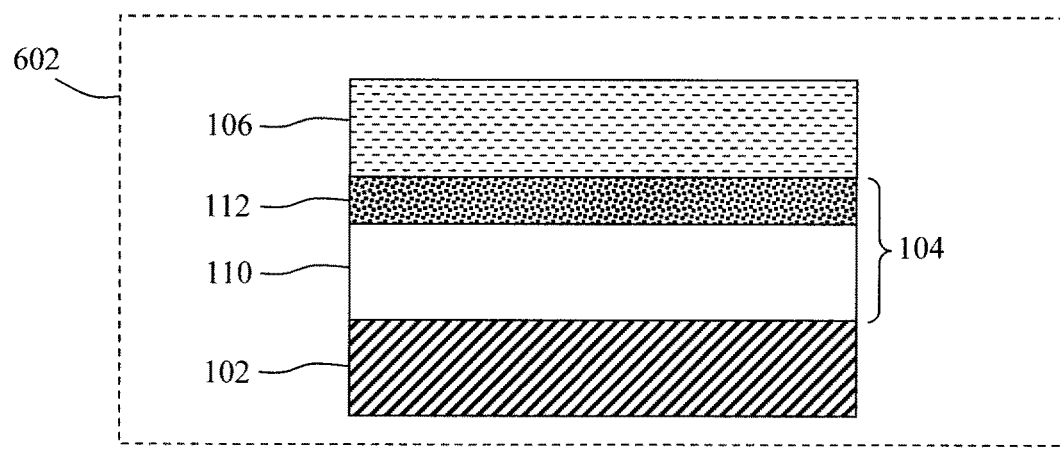
FIG. 6 is a cross-sectional diagram illustrating a cap layer having been deposited onto the base oxide layer, and a top electrode having been deposited onto the cap layer according to an embodiment of the present invention.

As shown in FIG. 6, the top electrode 106 is then deposited onto the cap layer 112. As provided above, suitable materials for the top electrode 106 include, but are not limited to, TiN and/or TaN. According to an exemplary embodiment, the top electrode 106 has a thickness of from about 100 Å to about 500 Å and ranges therebetween.

Importantly, the cap layer 112 and the top electrode 106 are deposited in-situ without any air exposure in between. This is done to ensure that the cap layer 112 is un-oxidized, i.e., there is no oxide formed at the interface of the cap layer 112 and the top electrode 106. This in-situ deposition of the cap layer 112 and the top electrode 106 can be carried out in a number of different ways.

For instance, according to an exemplary embodiment, the base oxide layer 110 disposed on the bottom electrode 102 are placed in a vacuum chamber 602. Plasma enhanced ALD or CVD in the vapor chamber 602 is then used to deposit, e.g., amorphous Si, to form the cap layer 112 on the base oxide layer 110. As provided above, the base oxide layer 110 and the cap layer 112 together form the insulator 104. Without breaking vacuum, ALD is then used to deposit, e.g., TiN and/or TaN, in the same vapor chamber 602 to form the top electrode 106 on the cap layer 112. As such, there will be no air exposure between forming the cap layer 112 and the top electrode 106. Thus, the cap layer 112 will be prevented from oxidation. Further, once covered by the top electrode 106, the cap layer 112 will remain un-oxidized after removal from the chamber 602. Namely, as provided above, the low resistivity layer 108 can optionally be formed on the top electrode 106. However, the deposition of the low resistivity layer 108 does not need to occur in-situ along with deposition of the cap layer 112 and top electrode 106.

According to another exemplary embodiment, the base oxide layer 110 disposed on the bottom electrode 102 again are placed in the vacuum chamber 602. PVD is then used to deposit, e.g., amorphous Si, to form the cap layer 112 on the base oxide layer 110 (which together form the insulator 104). Without breaking vacuum, PVD is used to deposit, e.g., TiN and/or TaN, in the same vapor chamber 602 to form the top electrode 106 on the cap layer 112. There will be no air exposure between forming the cap layer 112 and the top electrode 106. Thus, the cap layer 112 will be prevented from oxidation. Once covered by the top electrode 106, the cap layer 112 will remain un-oxidized after removal from the chamber 602, for example, to deposit the optional low resistivity layer 108 on the top electrode 106 which does not have to be performed in-situ.

Figure 7:
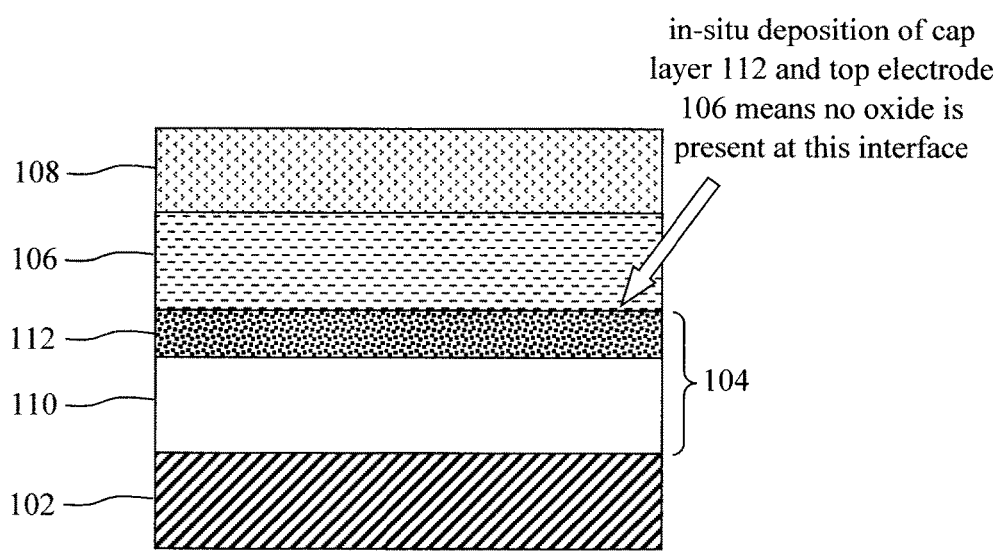
FIG. 7 is a cross-sectional diagram illustrating an optional low resistivity layer having been deposited onto the top electrode according to an embodiment of the present invention.
Figure 8:
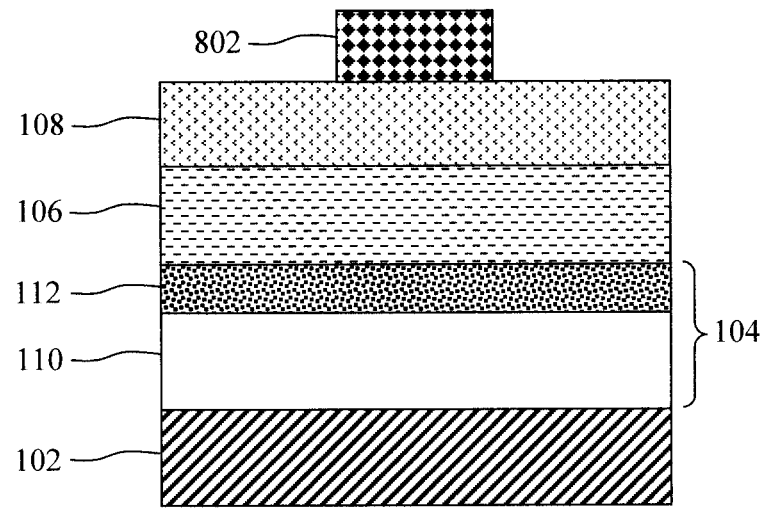
FIG. 8 is a cross-sectional diagram illustrating a patterned hardmask having been formed on the low resistivity layer (if present) otherwise directly on the top electrode according to an embodiment of the present invention.
Figure 9:
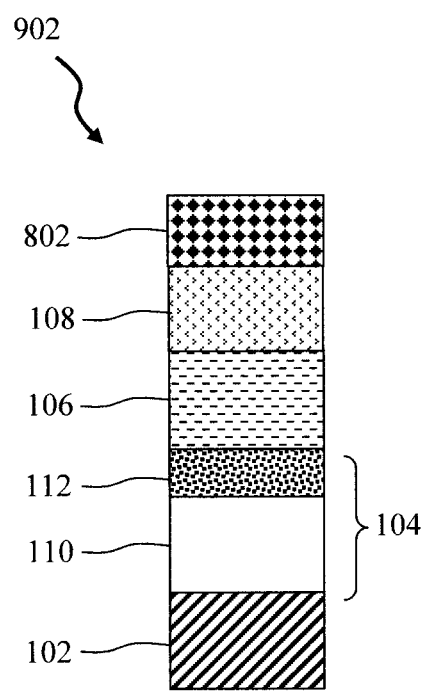
FIG. 9 is a cross-sectional diagram illustrating an etch using the patterned hardmask having been used to pattern the layers into one or more individual RRAM cells according to an embodiment of the present invention.

Next, as shown in FIG. 7, the low resistivity layer 108 is optionally deposited onto the top electrode 106. As provided above, suitable materials for the low resistivity layer 108 include, but are not limited to, TaN, W, Al and/or copper Cu. According to an exemplary embodiment, the low resistivity layer 108 has a thickness of from about 100 Å to about 500 Å and ranges therebetween. Benefits to employing the low resistivity layer 108 include realizing large RRAM cell areas depending on the target application. Namely, as described above, for large RRAM cell area, use of a low resistivity layer is preferable to sufficiently reduce spreading resistance. On the other hand, the top electrode (e.g., TiN) may be sufficient if the RRAM cell area is small. Thus, the need depends on the target RRAM cell area. Further, as highlighted above, deposition of the low resistivity layer 108 does not need to occur in-situ along with deposition of the cap layer 112 and top electrode 106.

The stack of layers, i.e., bottom electrode 102/insulator 104/top electrode 106/low resistivity layer 108, is then patterned into one or more individual RRAM cell stacks (or simply cells). To do so, a patterned hardmask 802 is first formed on the stack, i.e., on the low resistivity layer 108 (if present) otherwise directly on the top electrode 106. See FIG. 8. Patterned hardmask 802 marks the footprint and location of the RRAM cell(s).

The patterned hardmask 802 can be formed by first depositing a suitable hardmask materials onto the stack of layers, and then using standard lithography and etching techniques to pattern the hardmask material into one or more individual hardmasks 802. Suitable hardmask materials include, but are not limited to, nitride hardmask materials such as silicon nitride (SiN).

An etch using the patterned hardmask 802 is then used to pattern the stack of layers, i.e., bottom electrode 102/insulator 104/top electrode 106/low resistivity layer 108, into one or more individual RRAM cells 902. See FIG. 9. A directional (anisotropic) etching process such as reactive ion etching (RIE) may be employed for the RRAM cell etch. Following the RRAM cell etch, the patterned hardmask 802 can be removed, e.g., using a nitride-selective etching process. Removal of the patterned hardmask 802 enables contact to be made to the top metal layer(s) of the device, i.e., the low resistivity layer 108 (if present) and/or the top electrode 106.

As provide above, according to an exemplary embodiment the present RRAM cells 902 are arranged in a crossbar array, wherein each cell 902 is a synapse between a pre-neuron and post-neuron for neuromorphic computing. See, for example, FIG. 10 which illustrates a computing device 1000 having a crossbar array of RRAM cells 902.

Figure 10:
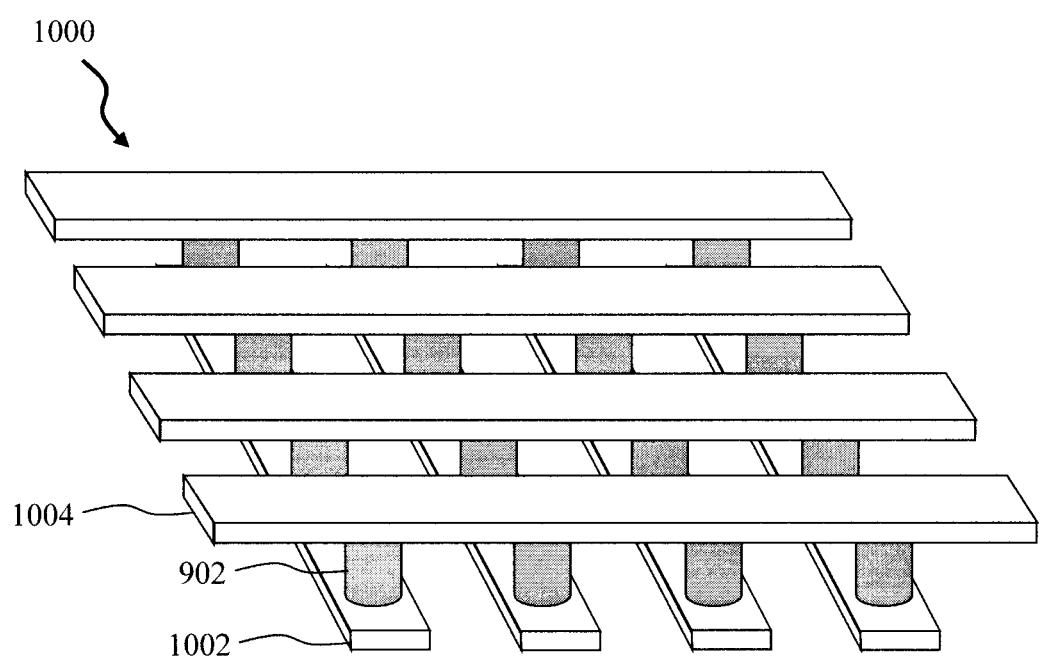
FIG. 10 is a cross-sectional diagram illustrating an exemplary computing device having a crossbar array of the present RRAM cells according to an embodiment of the present invention.

Specifically, as shown in FIG. 10, computing device 1000 includes a plurality of (first) metal lines 1002 oriented orthogonal to a plurality of (second) metal lines 1004. The RRAM cells 902 are present between the metal lines 1002 and 1004, at the intersections of the metal lines 1002 and 1004, with the metal lines 1002 being present below the RRAM cells 902 and the metal lines 1004 being present above the RRAM cells 902. Selection of a given one of the RRAM cells 902 can be accomplished by selecting a given one of the metal lines 1002 and a given one of the metal lines 1004 which the given RRAM cell intersects.

In this manner, to set the given RRAM cell 902 to the low resistivity state, a bias voltage is applied to the corresponding metal lines 1002 and 1004. In turn, to reset the given RRAM cell 902 to the high resistivity state, a voltage bias with the opposite polarity is applied to the corresponding metal lines 1002 and 1004.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a non-filamentary resistive random access memory (RRAM) device, comprising the steps of:

depositing a base oxide layer on a bottom electrode;
    depositing a cap layer on the base oxide layer; and
    depositing a top electrode on the cap layer, wherein the cap layer and the top electrode are deposited in-situ without any air exposure in between such that there is an absence of oxide at an interface between the cap layer and the top electrode,
wherein the method further comprises the steps of:
placing the base oxide layer disposed on the bottom electrode in a vacuum chamber;
depositing the cap layer on the base oxide layer in the vacuum chamber; and
depositing the top electrode on the cap layer in the vacuum chamber without breaking vacuum.

2. The method of claim 1, further comprising the step of: depositing a low resistivity layer on the top electrode.

3. The method of claim 2, wherein the low resistivity layer comprises a material selected from the group consisting of: tantalum nitride, tungsten, aluminum, copper and combinations thereof.

4. The method of claim 1, wherein the bottom electrode comprises a material selected from the group consisting of: titanium nitride, tantalum nitride, tungsten and combinations thereof.

5. The method of claim 1, wherein the bottom electrode has a thickness of from about 100 Å to about 500 Å and ranges therebetween.

6. The method of claim 1, wherein the base oxide layer comprises a metal oxide.

7. The method of claim 6, wherein the metal oxide is hafnium oxide.

8. The method of claim 1, wherein the base oxide layer has a thickness of from about 10 Å to about 50 Å and ranges therebetween.

9. The method of claim 1, wherein the cap layer comprises amorphous silicon.

10. The method of claim 1, wherein the cap layer has a thickness of from about 5 Å to about 20 Å and ranges therebetween.

11. The method of claim 1, wherein the top electrode comprises a material selected from the group consisting of: titanium nitride, tantalum nitride and combinations thereof.

12. The method of claim 1, wherein the top electrode has a thickness of from about 100 Å to about 500 Å and ranges therebetween.

13. The method of claim 1, wherein the cap layer is deposited on the base oxide layer using plasma enhanced atomic layer deposition or chemical vapor deposition, and wherein the top electrode is deposited on the cap layer using atomic layer deposition.

14. The method of claim 1, wherein the cap layer is deposited on the base oxide layer using physical vapor deposition, and wherein the top electrode is deposited on the cap layer using physical vapor deposition.

15. The method of claim 1, further comprising the step of: patterning the top electrode, the cap layer, the base oxide layer, and the bottom electrode into at least one individual RRAM cell.

16. An RRAM device, comprising:
a bottom electrode;
a base oxide layer disposed on the bottom electrode;
a cap layer disposed on the base oxide layer;
a top electrode disposed on the cap layer; and
a low resistivity layer disposed on the top electrode, wherein the low resistivity layer comprises a material selected from the group consisting of: tantalum nitride, tungsten, copper and combinations thereof, and wherein the cap layer is un-oxidized such that there is an absence of oxide at an interface between the cap layer and the top electrode.

17. The RRAM device of claim 16, wherein the base oxide layer comprises hafnium oxide.

18. The RRAM device of claim 16, wherein the cap layer comprises amorphous silicon.

19. A computing device, comprising:
a plurality of first metal lines oriented orthogonal to a plurality of second metal lines; and
RRAM cells between the first metal lines and the second metal lines, at intersections of the first metal lines and the second metal lines, wherein each of the RRAM cells comprises:
a bottom electrode;
a base oxide layer disposed on the bottom electrode;
a cap layer disposed on the base oxide layer;
a top electrode disposed on the cap layer; and
a low resistivity layer disposed on the top electrode, wherein the low resistivity layer comprises a material selected from the group consisting of: tantalum nitride, tungsten, copper and combinations thereof, and wherein the cap layer is un-oxidized such that there is an absence of oxide at an interface between the cap layer and the top electrode.

* * * * *